US012117500B2

(12) United States Patent
Hwang et al.

(10) Patent No.: US 12,117,500 B2
(45) Date of Patent: Oct. 15, 2024

(54) METHOD AND SYSTEM TO QUICKLY ANALYZE AND PREDICT BATTERY FAILURE AND SHORT-CIRCUIT

(71) Applicant: National Taiwan University of Science and Technology, Taipei (TW)

(72) Inventors: Bing-Joe Hwang, Taipei (TW); Sheng-Chiang Yang, Taipei (TW); Mohammad Kor, Taipei (TW); Wei-Nien Su, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 167 days.

(21) Appl. No.: 17/892,309

(22) Filed: Aug. 22, 2022

(65) Prior Publication Data
US 2023/0341470 A1    Oct. 26, 2023

(30) Foreign Application Priority Data
Apr. 21, 2022    (TW) ................... 111115319

(51) Int. Cl.
*G01R 31/396* (2019.01)
*G01R 31/367* (2019.01)
*G01R 31/52* (2020.01)

(52) U.S. Cl.
CPC ......... *G01R 31/396* (2019.01); *G01R 31/367* (2019.01); *G01R 31/52* (2020.01)

(58) Field of Classification Search
USPC .......................... 324/426, 430–435
See application file for complete search history.

(56) References Cited

U.S. PATENT DOCUMENTS

| | | | | |
|---|---|---|---|---|
| 7,028,063 | B1 * | 4/2006 | Sarmaru | H04L 27/265 |
| | | | | 708/406 |
| 2008/0151762 | A1 * | 6/2008 | Armstrong | H04W 24/08 |
| | | | | 370/241 |
| 2016/0103188 | A1 * | 4/2016 | Eifert | G01R 31/392 |
| | | | | 324/435 |
| 2016/0195587 | A1 * | 7/2016 | Lee | G01R 31/392 |
| | | | | 702/63 |
| 2020/0006802 | A1 * | 1/2020 | Xu | H01M 4/525 |
| 2022/0092961 | A1 * | 3/2022 | Banerjee | G01R 31/52 |
| 2023/0038963 | A1 * | 2/2023 | Peccia | G16B 30/00 |

* cited by examiner

*Primary Examiner* — Vincent Q Nguyen
(74) *Attorney, Agent, or Firm* — Best & Flanagan LLP

(57) ABSTRACT

A method and system to quickly analyze and predict battery failure and short-circuit comprises a battery cell unit carried with a sensor unit continuing detect a value of a condition of the battery cell unit to obtain a time domain result. The system will further convert the time domain result into a frequency domain result and will send an alarm or warning if such frequency domain result has exceeded a pre-set threshold. The present invention could accurately send the reminder or warning of the upcoming short-circuit at earlier stage of the battery cell unit by simply analyzing the time domain result converting as the frequency domain result. The system provided by the present invention has the ability to detect micro-circuit of the battery cell unit to facilitate detecting battery failure and short-circuit to avoid any emergency happened to the battery while using.

7 Claims, 8 Drawing Sheets

METHOD AND SYSTEM TO QUICKLY ANALYZE AND PREDICT BATTERY FAILURE AND SHORT-CIRCUIT

FIELD OF INVENTION

The present application is related to a method of predicting battery failure, especially to a method that can accurately predict the possibility of upcoming battery failure when the battery is still in normal operation.

The present invention has been developed primarily to be a predict system and method for detecting foreseeing battery failure of an electric vehicle for describing hereinafter with references and multiple embodiments to this application. However, it will be appreciated that the present invention is not limited to this particular method, field of use or effect.

BACKGROUND OF THE INVENTION

The present application is related to a method of predicting battery failure, especially to a method that can accurately predict the possibility of upcoming battery failure when the battery is still in normal operation.

To provide enough electricity duration, each electric vehicle carries multiple battery cells in series connection. Currently, a battery management system, also known as BMS, is utilized to monitor each battery cells condition by temperature, voltage and current value changes.

Battery failure of each battery cell normally starts from an extremely tiny short-circuit or a micro short-circuit during a normal operation stage. However, such micro short-circuit is not able to be detected by the conventional BMS with just a tiny or almost invisible voltage or current fluctuation. BMS could only detect a valid result when the value of such voltage or current fluctuation is large enough to initiate an alarm. The battery cells normally present in a condition of polarization stage which is one step closer to total failure. If the battery cells couldn't be repaired or changed in time, it might cause whole battery shot down or even a risk of fire and even explosion. Hence, it is eager to have a solution that will overcome or substantially ameliorate at least one or more of the deficiencies of a prior art, or to at least provide an alternative solution to the problems. It is to be understood that, if any prior art information is referred to herein, such reference does not constitute an admission that the information forms part of the common general knowledge in the art.

SUMMARY OF THE INVENTION

In order to solve the problem that the conventional BMS system cannot effectively monitor the battery condition when micro short-circuit occurs in normal operation stage, and needs to wait until the battery cell has a valid change of voltage or current fluctuation which is very close to total battery failure, the present invention provides a method and system to quickly analyze and predict battery failure and short-circuit.

In Accordance, a First Aspect of the Present Invention Provides a Method to Quickly Analyze and Predict Battery Failure and Short-Circuit Comprising:
    obtaining a value of a condition of a battery cell unit by a sensor unit of a battery system;
    recognizing a type of the value of the condition of the battery cell unit 11 and presenting as a time domain result, and moving to next step if the value is exceeding a preset first time domain threshold;
    converting the time domain result in to a frequency domain result;
    if a value of the frequency domain result converted from the time domain result exceeds a preset second frequency domain threshold, an alarm is issued from the battery system.

In accordance, a second aspect of the present invention provides a system utilizing the method as mentioned above comprising: a battery system, a cloud and a signal/data receiving unit which are electronically connected to each other by signals, wherein:
    the battery system includes a battery cell unit, a sensor unit and a signal transmission unit; the signal transmission unit continues to wire or wirelessly transmit the signal obtained from the battery cell unit by the sensor unit;
    the cloud includes a storage unit, an operation unit and a database, and the storage unit receives and stores a value of a condition of the battery cell unit transmitted by the signal transmission unit and transmits it to the operation unit for processing by the method as claimed in claim 1; the result is compared with a threshold value stored in the database to predict a short-circuit happening in the foreseeing future; and
    the signal/data receiving unit comprises electronic device capable of receiving electrical signals.

According to above description, the present invention is able to accurately analyze battery cell condition by transfer the detected index of battery cell such as voltage, current or temperature by a mathematical analysis method. Such method could effectively distinguishes all battery life stages and accurately predict when will the micro-short circuit occurs in an early stage to prevent any accidents or disasters happened causing by the battery cells failure.

Many of the attendant features and advantages of the present invention will become better understood with reference to the following detailed description considered in connection with the accompanying figures and drawings.

BRIEF DESCRIPTION OF THE DRAWINGS

The steps and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
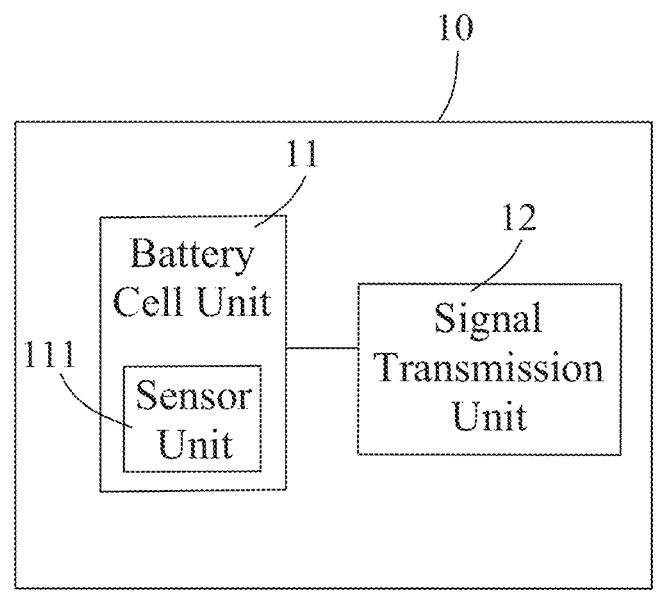
FIG. 1 is a block diagram illustrating a first embodiment of a system to quickly analyze and predict battery failure and short-circuit in accordance with the present invention.

Reference will now be made in detail to the present preferred embodiments of the invention, examples of which are illustrated in the accompanying drawings. Wherever possible, the same reference numbers are used in the drawings and the description to refer to the same or like parts. It is not intended to limit the method by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" may include reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to.

The present invention provides a system and method to quickly analyze and predict battery failure and short-circuit. With reference to FIG. 1, a first preferred embodiment of the present invention including a battery system 10.

The battery system 10 includes at least one battery cell unit 11. The battery cell unit 11 is connected with a sensor unit 111 to continuously detect a value of a condition of the battery cell unit 11 during life cycle (including charging and discharging cycles). The value of the condition of the battery cell unit 11 is transmitted as a signal by a signal transmission unit 12, for example Bluetooth or wireless signals. A first preferred embodiment of the battery cell unit 11 of the present invention is a lithium battery using $Li_6PS_5Cl$ (LPSC) as a solid electrolyte.

The aforementioned the value of the condition of the battery cell unit 11 includes but not limited to any relative electrical signal index or data such as voltage, current, resistance or any physical index or data such as temperature of the battery cell unit 11.

Figure 2:
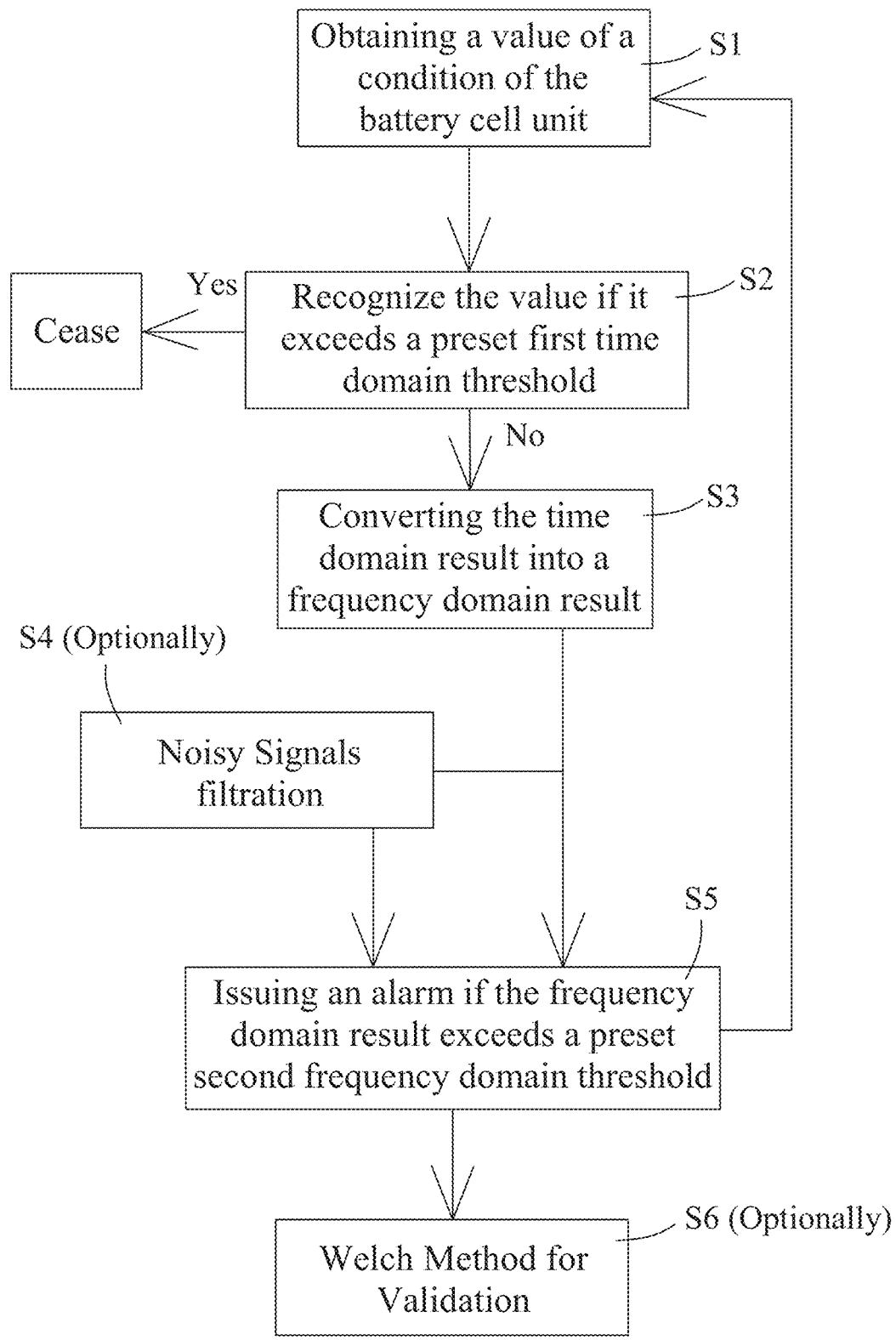
FIG. 2 is a flow chart of a preferred embodiment of a method and corresponded system to quickly analyze and predict battery failure and short-circuit in accordance with the present invention.

With reference to FIG. 2, the present invention also provides a method of how to quickly analyze and predict battery failure and short-circuit for aforementioned battery system 10. It comprises steps of:

Step S1) the sensor unit 111 continuously detects the value of the condition of the battery cell unit 11;

Step S2) recognizing a type of the value of the condition of the battery cell unit 11 and presenting as a time domain result, and moving to next step if the value is exceeding a preset first time domain threshold or otherwise cease this step S2 and back to former step S1;

The time domain result as abovementioned is referring to the value changed of the condition of the battery cell unit 11 over time (also known as time domain). In the step S2, the system of the present invention will determine if the value is exceeding the preset first time domain threshold. The whole operation in step S1 held in a normal operation stage of the battery cell unit 11.

Step S3) Converting the time domain result in to a frequency domain result; It is preferred to converting the time domain result in to a frequency domain result by a Fourier transform (FT), or more preferably a Fast Fourier Transform (FFT) or any other time domain to frequency domain mathematical converting means or equations. The value changed of the condition of the battery cell unit 11 over time is continuously converted to frequency domain result.

Step S4) (Optionally); if the converted frequency domain signal contains too much noise, then optionally a filter is used for signal filtering, for example, an infinite impulse response (IIR) or finite Impulse response (FIR) filters could be applied to such situation;

Step S5) When a value of the frequency domain result converted from the time domain result exceeds a preset second frequency domain threshold, it is predicted that the battery cell unit 11 is in a micro short-circuit condition and the battery system 10 issues an alarm.

Step S6) (optionally), further the prediction from step S5 could be validated by a Welch method.

Specifically, in the aforementioned step S3, the time domain result can be mainly obtained and presented as a relationship diagram between the value of the condition of the battery cell unit 11 over time during life cycles. As one preferred embodiment shown in FIG. 3, the time domain result can be divided as three different zones including zone 1 as a normal operation zone, zone 2 as a polarization operation zone and the last but not least zone 3 as a Internal short-circuit zone.

Figure 3:
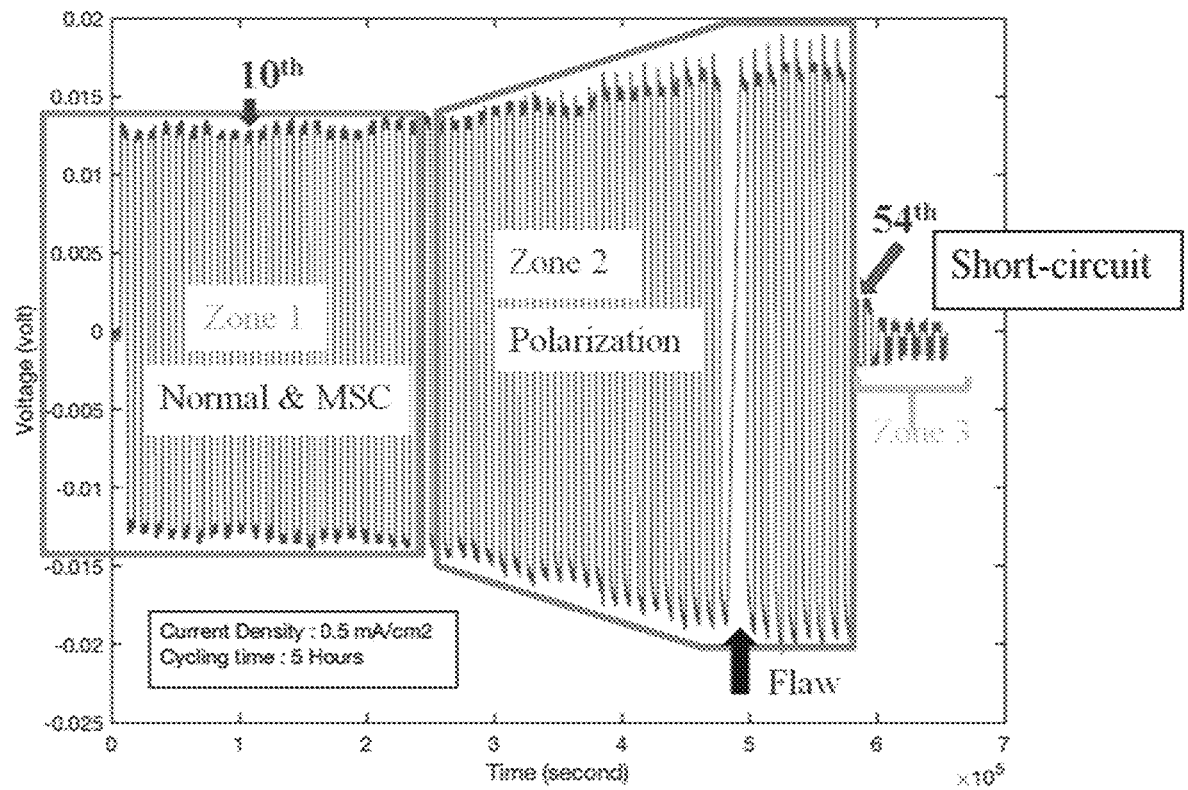
FIG. 3 is a time verse voltage diagram (time domain diagram) presenting a normal operation condition, a polarization condition and an Internal short-circuit condition of a battery cell unit in accordance with the present invention.

The embodiment presented in FIG. 3 was tested under a current density of 0.5 mA/cm² and a cycle time of 5 hours. Preferably, the preset first time domain threshold in the aforementioned step S2 of the present invention refers to the voltage value in the normal operation zone as zone 1 in FIG. 3. As shown in FIG. 3, the first time domain threshold of this embodiment can be set as 0.014 volts (V). If the changed value of the condition of the battery cell unit 11 is not exceeding than the first time-domain threshold, it means that the lithium battery is in a normal operating condition, and the present invention will further perform frequency domain conversion for the value of the state signal in this region if the value exceeding the threshold. However, the first time domain threshold may be adjusted according to different types of batteries or needs from different users.

The present invention utilizes the time domain result in zone 1, the normal operation zone shown in FIG. 3 to convert to the frequency domain result by below Fourier transform equation 1 trying to find out the timing of micro short-circuit happened and predicting the possible foreseeing Internal short-circuit or battery failure.

$$X(n) = \sum_{n=0}^{N-1} x(n) e^{\frac{-j2\pi nk}{N}} \quad \text{Equation (1)}$$

Meaning of each mathematical index presented in equation (1) is listed as following Table 1.

TABLE 1

| Index | Meaning |
|---|---|
| j | Imaginary numbers |
| e | Exponential |
| N | Number of samples |
| n | Current sample |
| k | Current frequency, k ∈ [0, N − 1] |

TABLE 1-continued

| Index | Meaning |
| --- | --- |
| x(n) | Sine value at sample n |
| X(n) | The Fast Fourier Transform which include information of both amplitude and phase |

Figure 4A:
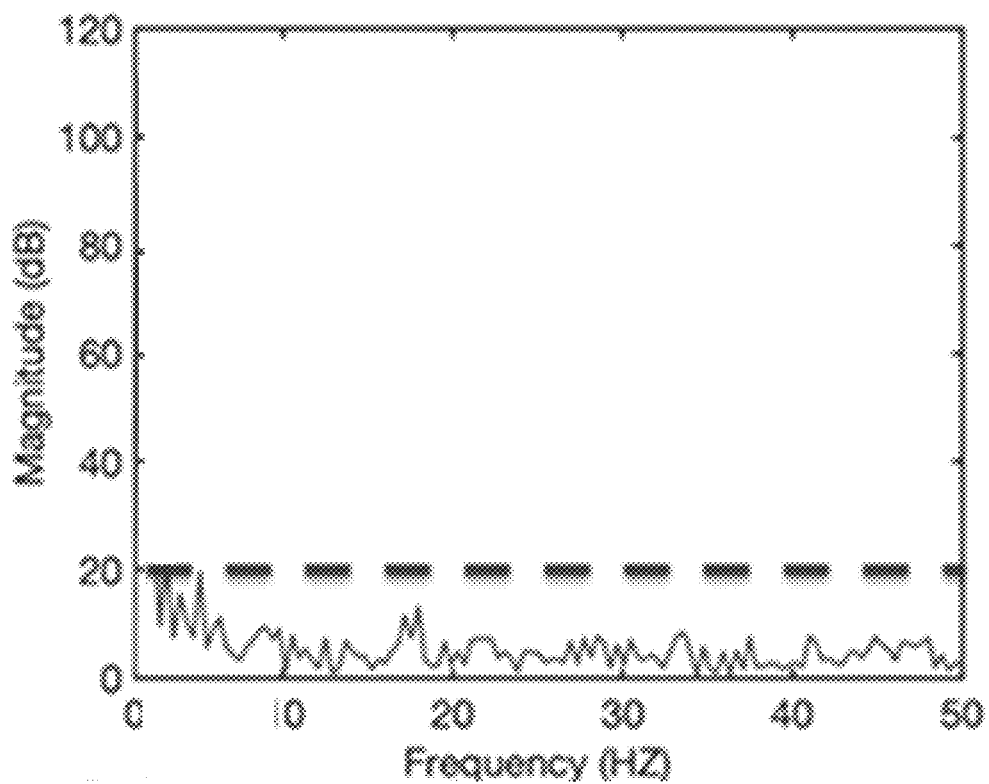
FIG. 4A and FIG. 4B are frequency verse voltage diagram (frequency domain diagram) presenting a normal operation condition and a micro short-circuit condition of a battery cell unit in accordance with the present invention.
Figure 4B:
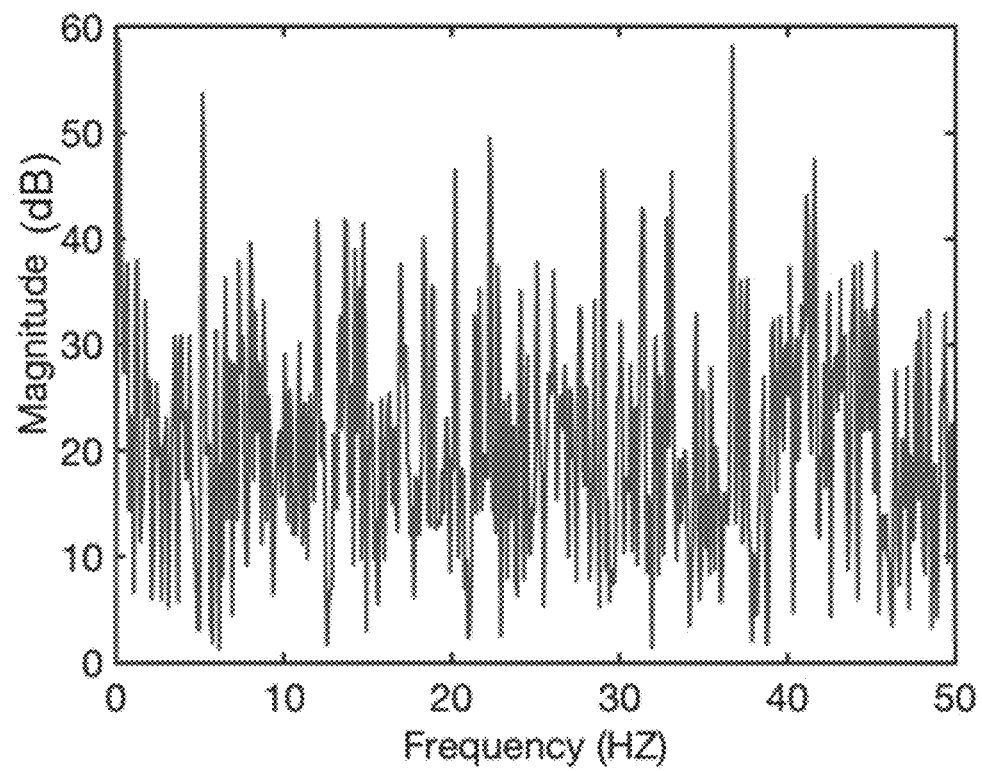

With reference to FIG. 4A to FIG. 4B, they are results obtained by converting the time domain into the frequency domain through the above equation. As shown in FIG. 4A, it is the frequency domain result of the ninth cycle time of life cycle in the normal operating zone as zone 1in accordance with FIG. 3. FIG. 4B is the frequency domain result of the tenth cycle time of life cycle in the normal operating zone as zone 1 in accordance with FIG. 3. In FIG. 4A, according to the different types of the battery cell unit 11, the present invention will have a preset second frequency domain threshold as the system predict standard. For example, the preset second frequency domain threshold in this embodiment in FIG. 4A is 20 (dB). However, the preset second frequency domain threshold may be different according to the different types of batteries or the needs of users.

With the continuous monitoring the voltage and the conversion of the time domain result to frequency domain result. At the 10th cycle of life cycle as shown in FIG. 4B, the intensity of the frequency domain result exceeds the threshold 20 (dB), which will be the timing of the micro-short circuit happened for the battery cell unit 11 in the normal operating state in zone 1. Since the battery cell unit 11 has a micro short-circuit in the normal operating state, it means that an Internal short-circuit will inevitably occur later. The present invention can hence issue an alarm or warning notification when the micro short-circuit occurs during the normal operation stage to ensure the safety of the user when using the battery.

In order to confirm that the lithium battery being tested in the embodiment truly has an Internal short-circuit state at the end, the present embodiment continues to monitor and convert the time domain result to frequency domain result. As shown in FIG. 3, the battery cell unit 11 does indeed appear in the zone 2 (the polarization stage) and the Internal short-circuit stage at the 54th life cycle in Zone 3.

Figure 5:
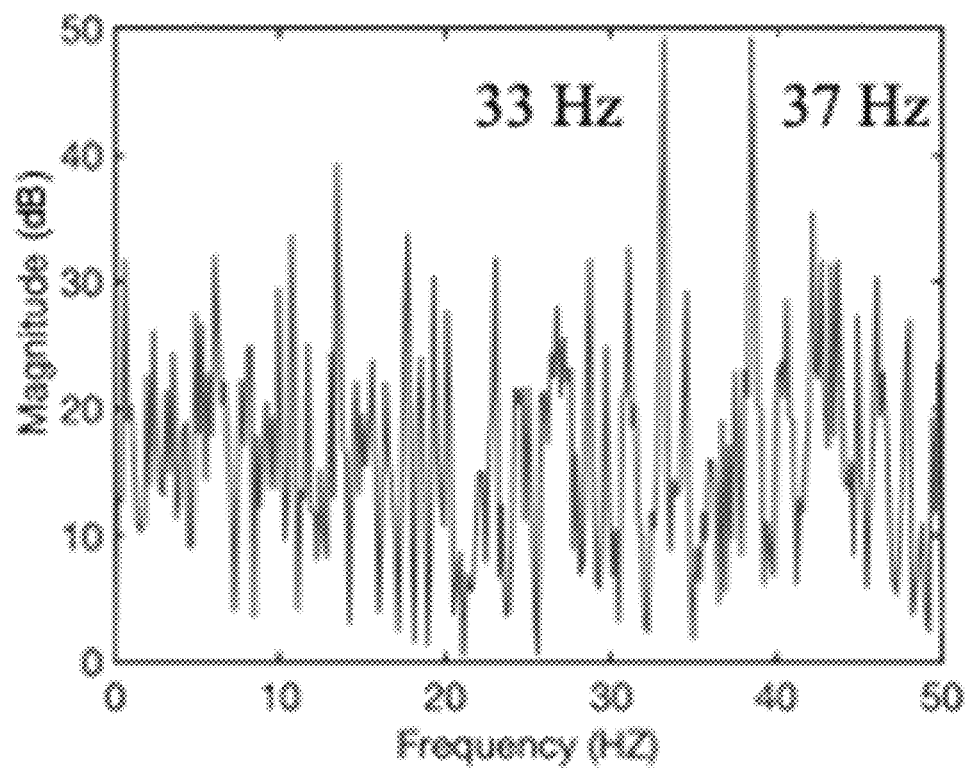
FIG. 5 is a frequency verse intensity diagram (frequency domain diagram) presenting a micro short-circuit condition of a battery cell unit in accordance with the present invention.

With further reference to FIG. 5, it is the conversion of the frequency domain result at 54$^{th}$ life cycle at zone 3 when the Internal short-circuit occurs. As the time passing and more and more life cycle times being consumed, the frequency domain result at the Internal short-circuit stage having a higher peak intensity compared to the frequency domain result at the normal operation stage or it could also considered that the peaks shifted to higher intensity when the Internal short-circuit occurs. It is also observed that the results or the peaks of frequency domain shift to higher results or peaks of frequency domain from the normal operation stage to the micro short-circuit stage to polarization operation stage and to the Internal short-circuit stage. For example, as reference to FIG. 5, two obvious high peaks at 33 Hz and 37 Hz are presented which is considered the peaks shifted to higher intensity compared the frequency domain result at the normal operation stage as shown in FIG. 4B. It could be concluded that the frequency intensity of the frequency domain result of the present invention gradually shifted from low frequency intensity to high frequency intensity from the normal operation stage of the battery cell unit 11 to the polarization stage, and finally to the Internal short-circuit stage.

Figure 6:
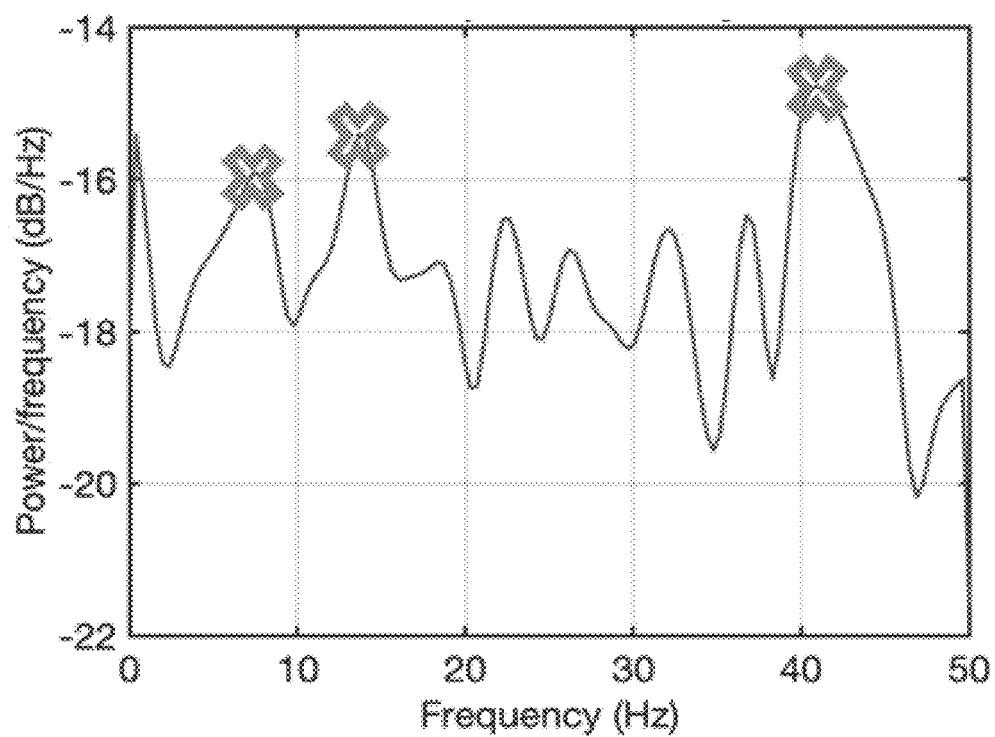
FIG. 6 is a spectrum analysis for validating the result presented by FIG. 4A by Welch method.

Further in the aforementioned step S6, following equations (2), (3), and (4) from Welch method could validate by introducing the converted frequency domain value (the aforementioned X(n) in Table 1) in to the equations (2), (3), and (4). As shown in FIG. 6, it is the validation result from Welch method corresponded to FIG. 4B. From the spectrum purification or filtration analysis performed by the Welch method equation (2) as shown in FIG. 6, a similar frequency peak result is indeed obtained. Therefore, it confirms the accuracy and effectiveness of the Fourier transform used in the aforementioned step S3.

$$P_k(v) = \frac{1}{W}|X_k(v)|^2 \quad \text{Equation (2)}$$

$$W = \sum_{m=0}^{M} \omega^2[m] \quad \text{Equation (3)}$$

$$s_x(v) = \frac{1}{K}\sum_{K=1}^{K} P_k(v) \quad \text{Equation (4)}$$

Meaning of each mathematical index presented in equation (2), equation (3) and equation (4) are listed as following Table 2.

TABLE 2

| Index | Meaning |
| --- | --- |
| Pk(v) | Form the modified periodogram value |
| v | Frequency variable, Hz-s |
| W | Window function |
| ω | Window parameter |
| M | Length of each segment by Discrete Fourier Transform |
| m | Current sample after FFT |
| Sx(v) | Average the periodogram values |
| K | Number of segments or batches |

Figure 7:
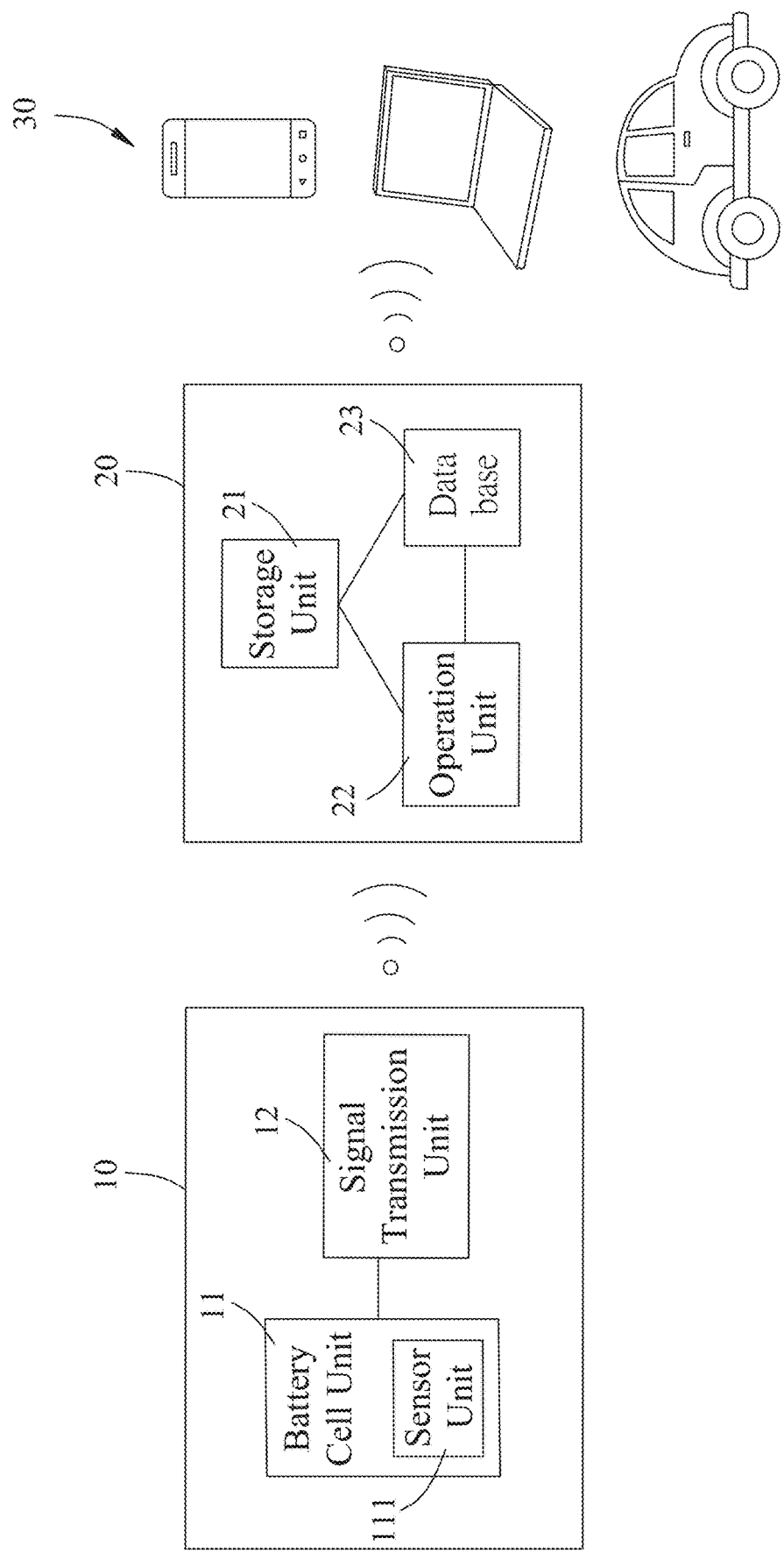
FIG. 7 is a block diagram illustrating a second embodiment of a system to quickly analyze and predict battery failure and short-circuit in accordance with the present invention.

With reference to FIG. 7, the system and method provided by the present invention can be further introduced into a cloud or an online monitoring and management system, which can include the battery system 10, a cloud 20 and a signal/data receiving unit 30 which are electronically connected to each other by signals, wherein:

The battery system 10 includes the battery cell unit 11, the sensor unit 111 and the signal transmission unit 12 as described above. The signal transmission unit 12 continues to wire or wirelessly transmit the signal obtained from the battery cell unit 11 by the sensor unit 111.

The cloud 20 includes a storage unit 21, an operation unit 22 and a database 23. The storage unit 21 receives and stores the value of the condition of the battery cell unit 11 transmitted by the signal transmission unit 12 and transmits it to the operation unit 22 for processing. The result is compared with the threshold value stored in the database 23 to predict the short-circuit happening in the foreseeing future.

The signal/data receiving unit 30 can be any electronic device capable of receiving electrical signals, including a mobile phone, a computer or a car computer, for accepting the analysis and prediction results obtained by the cloud 20 and alarming the user of the possible short-circuit coming for the battery.

The above preferred embodiment described by the present invention is just a key method for predicting battery failure in foreseeing future. However, when introduce to real practice, for example an electric vehicle; the present invention could be in a form of system connected to the battery of the such electric vehicle to obtain the value of condition and converting to usable signal to be processed and issue the alarm accurately to the user. The present invention can also be applied to a conventional battery management system (BMS) to predict the micro short-circuit and analyze the possibility of Internal short-circuit or even the battery failure in advance.

The above specification, examples, and data provide a complete description of the present disclosure and use of exemplary embodiments. Although various embodiments of the present disclosure have been described above with a certain degree of particularity, or with reference to one or more individual embodiments, those with ordinary skill in the art could make numerous alterations or modifications to the disclosed embodiments without departing from the spirit or scope of this disclosure.

What is claimed is:

1. A method to quickly analyze and predict battery failure and short-circuit comprising steps of:
    obtaining a value of a condition of a battery cell unit by a sensor unit of a battery system;
        the battery cell unit comprises a normal operation stage, a polarization stage and an Internal short-circuit stage in a one or multiple full cycle life times;
    recognizing a type of the value of the condition of the battery cell unit and presenting as a time domain result, and moving to next step if the value is exceeding a preset first time domain threshold;
    converting the time domain result in to a frequency domain result; and
    issuing an alarm from the battery system if a value of the frequency domain result converted from the time domain result exceeds a preset second frequency domain threshold when a micro short-circuit happened during the normal operation stage of the battery cell unit.

2. The method as claimed in claim 1, wherein the time domain result is converted in to the frequency domain result by the below equation (1), wherein $$X(n) = \sum_{n=0}^{N-1} x(n) e^{\frac{-j2\pi nk}{N}}, \quad \text{equation (1)}$$

wherein
    N represents a Number of samples;
    n represents a current sample
    k represents a current frequency and k [0,N-1]
    x (n) represents a sine value at sample n; and
    X (n) is a Fast Fourier Transform which includes information of both time and frequency domains.

3. The method as claimed in claim 1, wherein the value includes voltage, current, resistance, or temperature of the battery cell unit.

4. The method as claimed in claim 1, wherein results or peaks of frequency domain shift to higher results or peaks of frequency domain from the normal operation stage to the micro short-circuit stage to polarization operation stage and to the Internal short-circuit stage.

5. The method as claimed in claim 1, wherein the frequency domain result is further filtered by an infinite impulse response filter or a finite impulse response filter.

6. The method as claimed in claim 1, wherein the frequency domain result is further validated by a Welch method.

7. A system to quickly analyze and predict battery failure and short-circuit comprising:
    a battery system having a battery cell unit, a sensor unit, and a signal transmission unit, wherein the signal transmission unit transmits a signal obtained from the battery cell unit by the sensor unit;
    a signal/data receiving unit electronically connected by signals with the battery system, wherein the signal/data receiving unit comprises an electronic device capable of receiving electrical signals; and
    a cloud electronically connected by signals with the battery system and with the signal/data receiving unit, the cloud having a storage unit, an operation unit, and a database, wherein
    the storage unit receives and stores a value of a condition of the battery cell unit transmitted by the signal transmission unit and transmits it to the operation unit for processing by the method as claimed in claim 1 to predict a short-circuit happening in the foreseeable future.

* * * * *